US006654927B1

United States Patent
Sall et al.

(10) Patent No.: US 6,654,927 B1
(45) Date of Patent: Nov. 25, 2003

(54) ITERATIVE ERROR-CORRECTION FOR TURBO CODE DECODING

(75) Inventors: Mikhail A. Sall, St.Petersburg (RU); Victor V. Redkov, St.Petersburg (RU)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/480,004

(22) Filed: Jan. 10, 2000

(51) Int. Cl.[7] .................... H03M 13/00; H03M 13/03
(52) U.S. Cl. .................... 714/786; 714/794; 714/795
(58) Field of Search ................... 714/786, 794, 714/795; 375/262, 263, 265, 341

(56) References Cited

U.S. PATENT DOCUMENTS

| | | | | |
|---|---|---|---|---|
| 5,983,385 | A | * 11/1999 | Khayrallah et al. | ......... 714/755 |
| 6,023,783 | A | * 2/2000 | Divsalar et al. | ............ 714/792 |
| 6,161,209 | A | * 12/2000 | Moher | ......................... 714/780 |
| 6,189,123 | B1 | * 2/2001 | Anders Nystrom et al. | 714/751 |
| 6,192,503 | B1 | * 2/2001 | Chennakeshu et al. | ...... 714/796 |
| 6,202,189 | B1 | * 3/2001 | Hinedi et al. | ................ 714/786 |
| 6,266,795 | B1 | * 7/2001 | Wei | .............................. 714/755 |
| 6,292,918 | B1 | * 9/2001 | Sindhushayana et al. | ... 714/755 |
| 6,349,117 | B1 | * 2/2002 | Rhee | ........................... 375/265 |

OTHER PUBLICATIONS

J. Hagenauer, E. Offer, and L. Papke, "Iterative Decoding of Binary Block and Convolutional Codes", IEEE Transactions on Information Theory, vol. 42, No. 2, pp. 429–445, Mar. 1996.*

K. Gracie, S. Crozier, and A. Hunt, "Performance of a Low–Complexity Turbo Decoder with a Simple Early Stopping Criterion Implemented on a SHARC Processor", IMSC 99, Proceedings of the Sixth International Mobile Satellite Conference, Ottawa, Ontario, Canad.*

B. Kim and H. S. Lee, "Reduction of the Number of Iterations in Turbo Decoding Using Extrinsic Information", Proceedings of IEEE TENCON 99, Inchon, South Korea, pp. 494–497, 1999.*

A. Shibutani, H. Suda, and F. Adachi, "Complexity Reduction of Turbo De–coding," Vehicular Technology Conference, VTC 1999, vol. 3, pp. 1570–1574, 1999.*

A. Shibutani, H. Suda, and F. Adachi, "Reducing Average Number of Turbo Decoding Iterations", Electronics Letters, vol. 35, pp. 701–702, 1999.*

R. Y. Shao, S. Lin, and M. P. C. Fossorier, "Two Simple Stopping Criteria for Turbo Decoding", IEEE Transactions on Communications, vol. 47, pp. 1117–1120, 1999.*

(List continued on next page.)

*Primary Examiner*—Albert Decady
*Assistant Examiner*—Joseph D. Torres
(74) *Attorney, Agent, or Firm*—Birch, Stewart, Kolasch & Birch, LLP

(57) ABSTRACT

An iterative error-correction for decoding digital data transmitted or broadcasted is disclosed. The present invention is especially effective when there is high transmission noise and is applicable in decoding Turbo codes. The iterative decoding generally utilizes at least two parallel decoding processes and comprises two iterations from which the decoded data is obtained by combining decoded elements of the iterations. Also, for each iteration, an intermediate decoded data element is multiplied by a scaling factor based upon parameters of the previously decoded data element block and is used on the next decoding iteration. By utilizing at least two parallel decoding processes, the number of errors is significantly reduced and the decoding process may be optimally terminated.

21 Claims, 4 Drawing Sheets

OTHER PUBLICATIONS

S.S. Pietrobon, "Implementation and performance of a Serial MAP decoder for use in an Iterative Turbo Decoder," IEEE Int. Symp. Inform. Theory, Whistler, British Columbia, Canada, p. 471, Sep. 1995.

S.S. Pietrobon, "Implementation and performance of a Turbo/MAP decoder," Int. J. Satellite Commun., vol. 16, pp. 23–46, Jan.–Feb. 1998.

L. Bahl, J. Cocke, F. Jelinek and J. Raviv, "Optimal Decoding of Linear Codes for Minimizing Symbol Error Rate," IEEE Trans. Inform. Theory, vol. IT–20, pp. 284–287, Mar. 1994.

J. Hagenauer and P. Hoeher, "A Viterbi Algorithm With Soft–Decision Outputs and Its Applications," GLOBECOM '89, Dallas, Texas, pp. 47.1.1–47.1.7, Nov. 1989.

* cited by examiner

ITERATIVE ERROR-CORRECTION FOR TURBO CODE DECODING

FIELD OF THE INVENTION

The present invention relates to decoders which decode error correction codes and more particularly to turbo-code decoders.

DISCUSSION OF THE RELATED ART

A turbo encoder produces a sequence of data elements, namely the subsequences of the source data elements and the subsequences of the redundant data elements. The redundant data elements are obtained by a convolution procedure. A part of the redundant data elements may be punctured in accordance with predetermined rules. U.S. Pat. No. 5,446,747 discloses the turbo code structure and is fully incorporated by reference herein.

The method of turbo coding source digital data elements generally comprises the steps of implementing at least two independent and parallel steps of systematic convolution coding, wherein each of the steps takes into account all of the data elements and provides parallel outputs of distinct series of coded data elements; and temporal interleaving of the source data elements to modify their order. The turbo codes may have a block structure and the size of the transmitted block depends upon the interleaver size.

The decoding of turbo codes is performed iteratively. At every iteration, at least one intermediate data element is decoded and using a decoded intermediate element, the next data element to be decoded is estimated. Thus, for each iteration, at least one intermediate data element is obtained by a combination of the received data element with the estimated data element and the obtained intermediate data element is decoded. The data elements are estimated by using a maximum likelihood algorithm such as a modification of the maximum a posteriori (MAP) algorithm or the soft-output Viterbi algorithm (SOVA). The MAP algorithm results in a better estimation than the Viterbi for data of low signal to noise ratio.

The general concepts of iterative turbo decoding utilizing the MAP and SOVA algorithms are disclosed by Bahl et al. in "*Optimal decoding of linear codes for minimizing symbol error rate,*" IEEE Trans. Inform. Theory, vol. IT-20, pp. 284–287, March 1974; by Pietrobon in "*Implementation and performance of a serial MAP decoder for use in iterative turbo decoder,*" IEEE Int. Symp. Inform. Theory, p. 471. September 1995 and "*Implementation and performance of a turbo/MAP decoder,*" Int. J. Satellite Commun., vol. 16, pp. 23–46, January–February 1998; and by Hagenauer in "*A viterbi algorithm with soft-decision outputs and its applications,*" GLOBECOM'89, pp. 47.1.1–47.1.7, November 1989 and these references are fully incorporated by reference herein.

Typically, the iterative process includes usage of the received source data element in each iteration and subtraction of the decoded data element from the estimated data element. Also, an iterative decoder designed for channels with additive white Gauss noise does not work well for channels with correlated noise, for Rayleigh fading channels or for channels described using Gilbert-Elliot model. Mainly, the turbo decoding algorithm is not as effective for real, natural noises as it is for model Gauss noise channel.

Moreover, terminating the iterative process is a problem for the turbo decoding algorithm. Because errors begin to increase or saturate after a certain number of iteration, a greater number of iterations does not necessarily yield the best result. However, the selection of the optimal number of iteration is difficult.

OBJECTIVES OF THE INVENTION

An object of the present invention is to solve at least the problems and disadvantages of the related art.

Accordingly, an object of the present invention is to provide a digital data decoding method with a high corrective capacity.

Another object of the present invention is to improve the quality of the turbo code decoding, particularly for transmission channels with a low signal to noise ratio.

A further object of the present invention is to provide a decoder of relatively easy manufacture and of high performance. Thus, an object of the present invention is to provide a decoding that can be used in a wide variety of applications and that can be implemented based on relatively simple integrated circuits.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

To achieve the objects and in accordance with the purposes of the invention, as embodied and broadly described herein, the present invention includes at least two iterative decoding procedures. An output of decoded data is obtained by a combination of decoded data elements from the iterative decoding procedures. Also, weights may be applied during the combination of decoded data elements. Each of the iterative decoding procedures includes consecutive steps from which a decoded data element is estimated. The estimation is performed by one of either a maximum likelihood algorithms such as different modifications of the maximum a posteriori algorithm or the soft-output Viterbi algorithm.

According to the present invention, an intermediate block of estimated data elements to be decoded is re-normalized. At each iteration, the intermediate data elements are multiplied by a scaling factor dependent upon statistical parameters of the decoded element block. The result of this multiplication or re-normalization is a decoded data element used as an input for decoding data elements in the next iteration.

The decoder for the decoding method of the present invention may be designed with cascade of identical modules, where each module corresponds to one iteration. By varying the number of iterations or modules, the quality level of the receiver may be varied. Also, each module performs a computation of the intermediate decoded data element, a computation of the block of data element characteristics, and a calculation of the decoded data element.

The decoding method according to the present invention comprises decoding of received data elements using at least two decoding procedures; comparing the data elements decoded by different decoding procedures; and calculating a weighted sum of the decoded data elements resulting from the decoding procedures. In the decoding method, each decoding procedure includes consequent decoding of received or previously decoded data elements with redundant data elements. The selection and order of redundant data elements to be used in decoding of the received previously decoded data are characteristics of the particular decoding procedure utilized. Also, each procedure further includes temporal interleaving of the decoded data elements, identical to an interleaving in the coding; de-interleaving the data elements by a symmetrical de-interleaving method to the interleaving method; and normalizing the decoded data elements by multiplication with a scalar factor dependent upon a block of decoded element parameters.

BRIEF DESCRIPTION OF THE DRAWING

The invention will be described in detail with reference to the following drawings in which like reference numerals refer to like elements wherein.

DETAILED DESCRIPTION OF THE PREFERRED EMBODIMENTS

The present invention utilizes a decoding method of at least two simultaneous iterative procedures. The output of the decoder is a combination of the outputs of these at least two procedures. The present invention allows a decoding with a particularly low output bit error rate even in the presence of high transmission nose, Rayleigh fading, and correlated non-Gauss noises.

Figure 1:
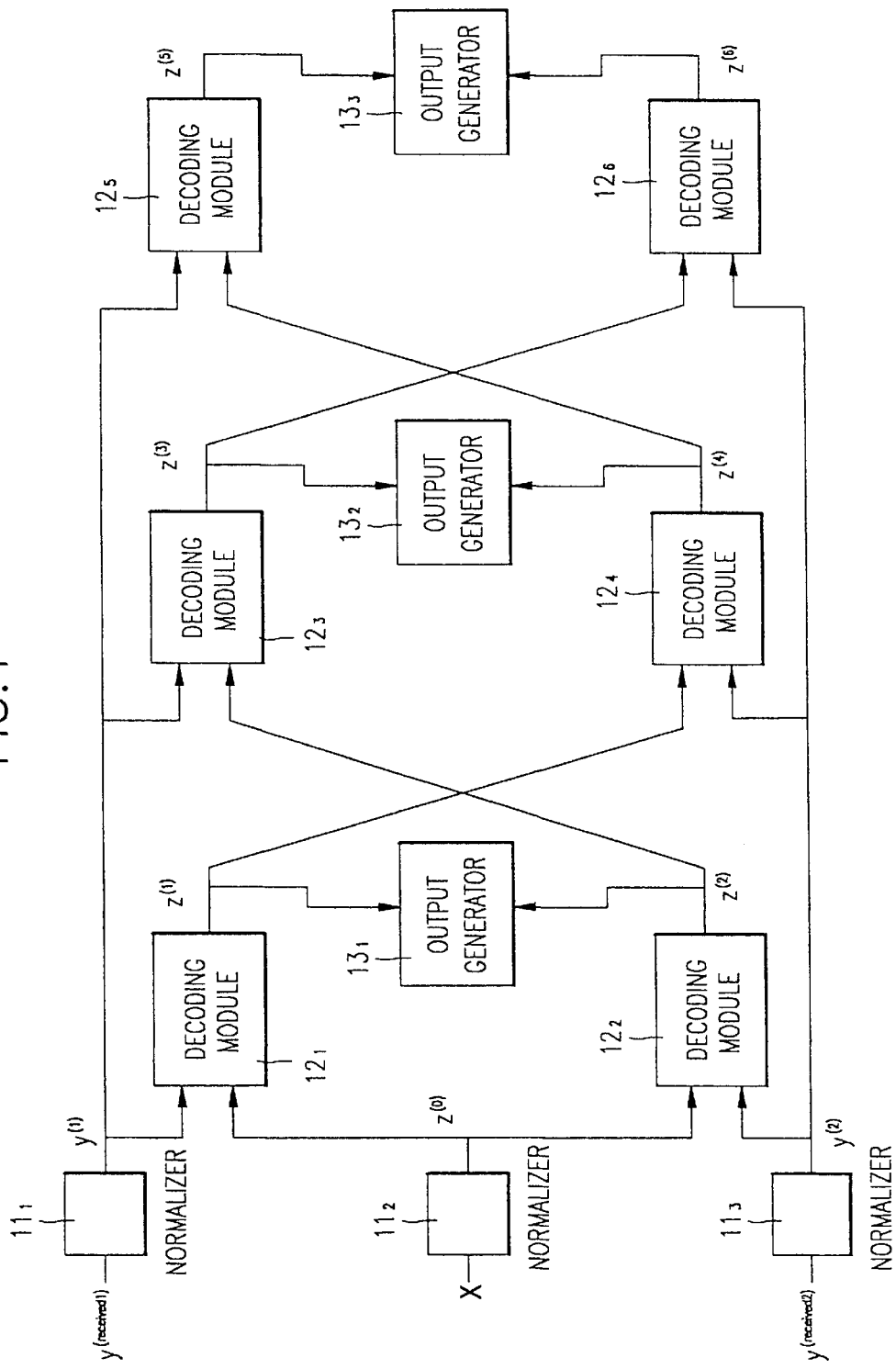
FIG. 1 is a block diagram of a modular decoder according to an embodiment of the present invention with one source data element, two redundant data elements, six decoding modules, and three output generators.

The decoding method according to the present method will be presented with reference to the decoder in FIG. 1 including normalizers $11_1 \sim 11_3$ receiving the coded data elements to be decoded; decoding modules $12_1 \sim 12_6$ decoding the input data elements; and output generators $13_1 \sim 13_3$ outputting the decoded data elements. As mentioned above, an essential characteristic of the present iterative decoding method is an implementation of at least two decoding procedures. In FIG. 1, two decoding procedures are realized in the first set of modules $12_1$, $12_4$, $12_5$ and in the corresponding second set of modules $12_2$, $12_3$, $12_6$. Each first and second module pair carries out an iteration and by cascading of n pairs of modules, n iterations of the decoding method may be implemented. Also, in the preferred embodiment, the first set of modules and the second set of modules decode the input data elements utilizing different decoding procedures defined by the order and the selection of redundant data elements. Moreover, more sets of modules may be implemented in parallel utilizing different decoding procedures.

Particularly, FIG. 1 is an example of a decoder for a 1/3 turbo code with one received source data element x, and two redundant received data elements $y^{(received\ 1)}$, $y^{(received\ 2)}$. For m redundant code elements, the decoding method may include up to m decoding procedures. Also, the connections between the decoding modules corresponding to the consecutive iterations are fixed in a systematic way such as circling or a stochastic way. The operation of each normalizers $11_1$, $11_2$, $11_3$ will be next discussed.

As seen in FIG. 1, the normalizer $11_1$ receives the redundant data element $y^{(received\ 1)}$, the normalizer $11_2$ receives the source data element x to be decoded, and the normalizer $11_3$ receives redundant data element $y^{(received\ 2)}$. The input data elements of the decoder may be represented in the form of a sum $r_k^{(received)} = \mu_k i_k + w_k$, where $i_k$ is an estimation of input data bit equal to ±, $\mu_k$ is some random positive magnitude with mean value equal to $\mu$, $w_k$ is a random noise sequence with variance σ and represents an additive noise, and $r_k^{(received)}$ is equal to $y^{(received\ 1),\ yreceived\ 2)}$ or x. Each normalizers $11_1$, $11_2$, $11_3$ first computes a scaling factor F to normalize the input data sequence. The scaling factor F can be computed with Equation 1 below, where D is a square mean of the received data elements and M is a mean of the received data elements.

$$F = \frac{2\mu}{\sigma^2} \approx \frac{2}{D/M - M} \qquad (1)$$

After computing the scaling factors, each normalizers $11_1$, $11_2$, $11_3$ multiplies the received data with the corresponding scaling factors. The normalized data sequences are then input to the decoding modules for the iterative decoding. Particularly, each decoding module $12_1 \sim 12_6$ has two inputs, one for the redundant data element $y^{(k)}$ and the other for the data element $z^{(j)}$ representing the source data element x to be decoded. Thus, the normalized redundant data sequence $y^{(received\ 1)}$ is input to the first set of decoding modules $12_1$, $12_3$, $12_5$ from the normalizer $11_1$, the normalized source data sequence x is input to the first pair of the decoding modules $12_1$ and $12_2$ from the normalizer $11_2$, and the normalized redundant data sequence $y^{(received\ 2)}$ is input to the second set of decoding modules $12_2$, $12_4$, $12_6$ from the normalizer $11_3$. Also, as seen in FIG. 1, outputs from each pair of decoding modules are input respectively to the next pair of decoding module as the source data sequence x. More particularly, the data elements $z^{(1)} \sim z^{(4)}$ are each an estimation of the received data element x to be decoded.

Figure 2:
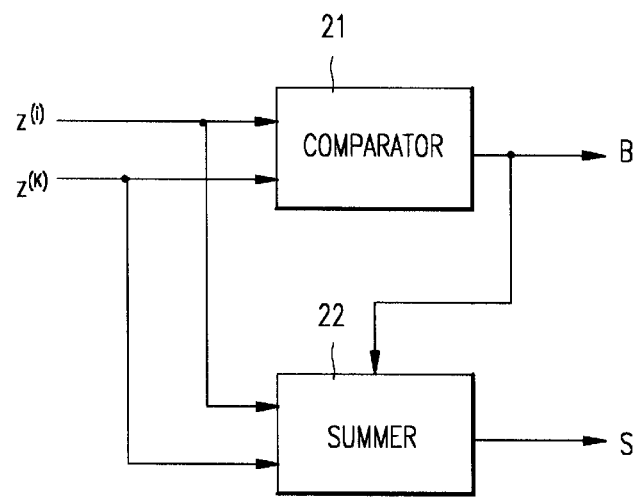
FIG. 2 is a block diagram of an output generator of FIG. 1 with a comparator and a block for performing weighted summation according to an embodiment of the invention.

The decoder of the present invention also includes output generators $13_1$, $13_2$, $13_3$, generating and outputting the decoded data elements of the decoder. FIG. 2 shows a general structure of the output generator of FIG. 1 including a comparator 21 and a summer 22. The comparator 21 receives the decoded data elements $z^{(j)}$, $z^{(k)}$ from respective one of each set of decoding modules, in this case from the pair of the decoding modules. The comparator 21 then compares the at least two decoded data element blocks $z^{(j)}$, $z^{(k)}$ and generates a binary signal B as a termination signal based upon a predetermined criterion. For example, the termination signal may be generated if all or almost all the decoded data elements in blocks decoded by the different decoding modules are equivalent with respect to the interpreted bit streams. The termination signal triggers and activates the summer 22 to compute the final output of the decoder.

In the preferred embodiment, the output of the decoder is calculated by summer 22 either when a termination signal is present or after the last step of the iterative process. The summer 22 also receives the decoded data elements $z^{(j)}$, $z^{(k)}$ from respective one of each set of decoding modules to generate the output data elements. This output is calculated by combining the estimated data elements to be decoded obtained from the previous iterations. Moreover, the combination may be a weighted summation of the estimated decoded data elements obtained from the previous iterations.

The data element $z^{(j)}$ is determined as the emitted symbol, but this data element would be affected by additive and other types of noises from the channel and from the decoding process. Thus, a computation of a weighted sum would significantly decrease the noise influence and thereby reduce the error rate.

Figure 3:
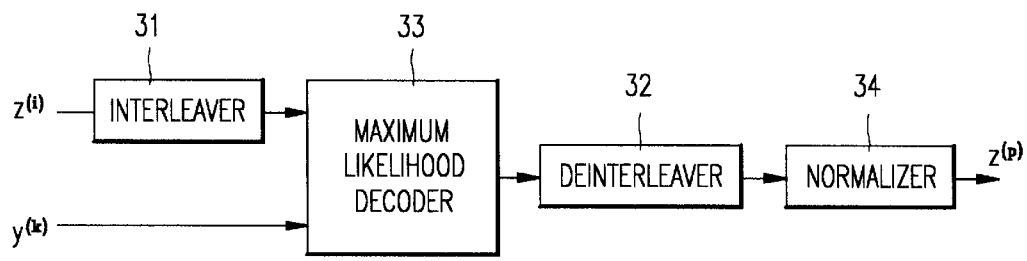
FIG. 3 is a block diagram of a decoder module according to an embodiment of the present invention including an interleaver, a maximum likelihood decoder, a de-interleaver, and a normalizer.

FIG. 3 shows the structure of a decoding module of FIG. 1 including an interleaver 31, a maximum likelihood decoder 33, a de-interleaver 32, and a normalizer 34. The interleaver 31 and the corresponding de-interleaver 32 are utilized when the redundant data element sequence is obtained after the interleaving of the initial source data sequence during the coding. In the preferred embodiment, the maximum likelihood decoder 33 decodes the interleaved data, i.e. estimates parameters of the received data elements, by utilizing a modification of the MAP or SOVA algorithm. However, any other decoding algorithm may be utilized.

Assuming an input sequence of $R=(R_1, \ldots, R_N)$ where $R_k$ is a pair of data elements, one of which is a source data element from the coded sequence and the other is a redundant data element, the maximum likelihood decoder 33 operates as follows. An intermediate decoded data sequence of the decoding process is a set of log-likelihood ratios $\lambda=(\lambda_1, \lambda_2, \ldots, \lambda_N)$, where $\lambda_k=\log([\Pr(i_k=1|R)]/[\Pr(i_k=-1|R)])$. In the ratio, $i_k$ is the sent bit where $i_k=\pm1$ and $\Pr(i_k=\pm1|R)$ is the probability that the sent bit is equal to $\pm1$ for an input sequence R. These intermediate data elements may be represented in the form of the sum $\lambda_k=\mu_k i_k+w_k$, where $i_k$ is an estimation of the sent information bit and is $\pm1$, $\mu_k$ is a random positive magnitude, and $w_k$ is a random sequence with a variance $\sigma$ representing an additive noise. Furthermore, the normalizer 34 computes the scaling factor for the intermediate data elements of the decoding using a formulae such as Equation 1. Thereafter, the normalizer 34 multiplies the intermediate data sequences by the computed scaling factor.

Therefore, the present invention implements at least two parallel decoding procedures, wherein a decoded data element is obtained from a combination of the at least two procedures. Also, the decoded information from one decoding module is transmitted to another after a re-normalization of the output from the maximum likelihood decoder. Finally, the present invention includes a comparator which compares the outputs from the at least two procedures by which the termination of the decoding is controlled. The usage of the comparator is an effective way to choose the optimal number of iterations, thereby preventing generation of new errors. As a result, the present invention diminishes the output error rate for relatively low signal to noise ratios, especially for Rayleigh fading channels and for correlative Gauss noise.

Figure 4:
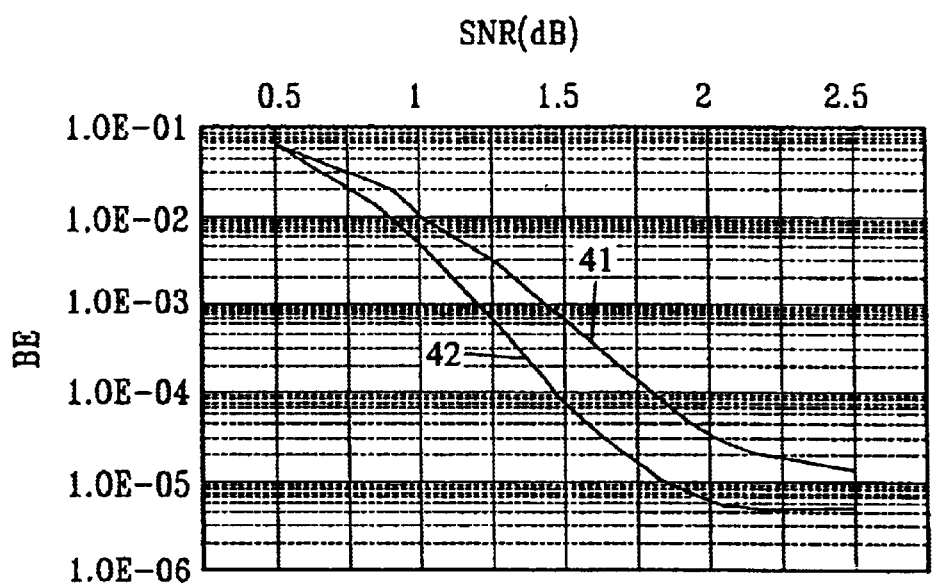
FIG. 4 is graph of a binary error rate comparing the method according to an embodiment of the present invention with a conventional method for a channel with additive Gauss noise.
Figure 5:
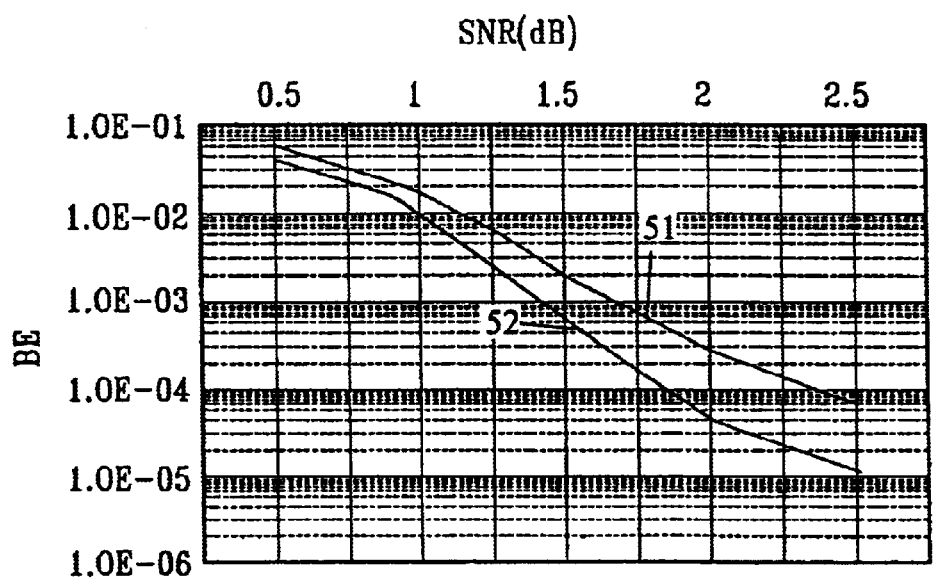
FIG. 5 is graph of a binary error rate comparing the method according to an embodiment of the present invention with a conventional method for a channel with additive correlated Gauss noise.
Figure 6:
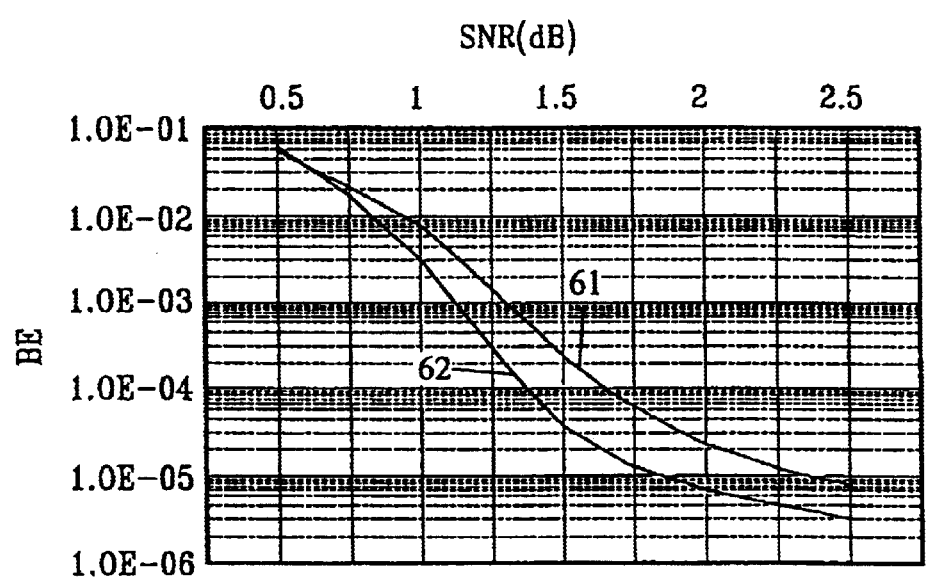
FIG. 6 is graph of a binary error rate comparing the method according to an embodiment of the present invention with a conventional method for a Rayleigh fading channel with additive white Gauss noise.

FIGS. 4–6 show examples of the results obtained by the present decoder for 1/3 turbo code with coding polynomials 31, 23, and pseudo-schochastic interleaver with block size of 1024 bits plus the tail bits. Particularly, the log-MAP has been used in the decoding module. FIGS. 4–6 also show results obtained by a standard log-MAP decoding algorithm to be compared with the present invention. A standard log-Map decoding algorithm disclosed in "Implementation and performance of a turbo/MAP decoder" by S. S. Pietrobon, Int. J. Satellite Commun., vol. 16, pp. 23–46, January–February 1998, is fully incorporated by reference herein.

In FIGS. 4–6, the x-axis represents the signal to noise ratio (SNR) of the transmission channel and the y-axis represents the observed binary error rate. The curves 41, 51 and 61 correspond to the standard method and the curves 42, 52 and 62 correspond to the present method. For a transmission with correlated Gauss noise in FIG. 5, the auto-correlation coefficient of two consecutive noise terms is equal to 0.8. For a transmission by a Rayleigh fading channel with additive Gauss noise, the SNR is a formal SNR that is defined from the equity of Equation, where $\beta$ is the parameter of Rayleigh pdf $f(x)=2\beta x \cdot \exp(-\beta x^2)$ for $x \geq 0$, $\sigma_G$ is a variance of the Gauss noise, and R is a code rate equal to 1/3.

$$\frac{1}{\beta} - \frac{\pi}{4}\beta + \sigma_G^2 = \frac{1}{2R} \cdot 10^{-0.1 \sim SNR} \qquad (2)$$

An advantage of the invention is that the comparison of data elements that are results of different decoding procedures can be used as a criterion for decoding process termination. For example, the decoding process may be terminated if all the decoded data elements in block have the same sign for all the decoding procedures. Furthermore, the invention can be applied whenever it is necessary to transmit digital information with a certain degree of reliability even via highly noise-ridden channels. For example, the invention may be implemented for satellite communications or CDMA systems. Thus, the invention can be applied similarly to any type of error-prone transmission. Finally, any type of turbo codes can be decoded according to the present invention. The code may be of a different block length, polynomials and tail types.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method for decoding received source data elements, comprising:

providing at least a first set and a second set of n decoding modules, the nth decoding module of the first set and the nth module of the second set performing decoding procedures in parallel, the first decoding module of each of the first and second set of n decoding modules receiving two inputs, a first input being a normalized redundant data element, and a second input representing a normalized source data element;

decoding the received data elements by at least two decoding procedures being performed in parallel;

repeating said at least two decoding procedures for at least two iterations;

selectively terminating said at least two decoding procedures prior to the last iterations of said at least two decoding procedures based upon the outputs of said at least two decoding procedures; and outputting decoded data elements.

2. A method of claim 1, wherein said repeating step includes using outputs of previous decoding procedures of said at least two decoding procedures as input data elements to be decoded in the iterations.

3. A method of claim 1, wherein each of said at least two decoding procedures comprises:
estimating parameters of received data elements to output intermediate decoded data elements;
calculating a scaling factor; and
normalizing the intermediate decoded data elements by multiplying the received data elements with the scaling factor.

4. A method of claim 3, further comprising:
calculating the scaling factor by the equation, $$F = \frac{2\mu}{\sigma^2} \approx \frac{2}{D/M - M}$$

where D is a square mean of the received data elements and M is a mean of the-received data elements.

5. A method of claim 4, further comprising:
receiving redundant data elements; and
estimating parameters of the received data elements utilizing the received redundant data elements.

6. A method of claim 5, wherein said decoding step further includes:
interleaving the received data elements by an interleaving method used during a coding process of the data elements; and
de-interleaving the intermediate decoded data elements prior to the normalizing by a de-interleaving method symmetrical to the interleaving method.

7. A method of claim 1, wherein in said decoding step, said at least two decoding procedures decode the received data elements by a maximum likelihood decoding algorithm of either a Viterbi or maximum a posteriori algorithm.

8. A method of claim 1, wherein at least two of said at least two decoding procedures are different from each other.

9. A method of claim 1, wherein said terminating step includes terminating said at least two decoding procedures either after the last iteration or when outputs of said at least two decoding procedures are equivalent.

10. A method of claim 1, wherein said outputting step includes calculating a sum of the outputs from said at least two decoding procedures.

11. A method of claim 10, wherein said sum is a weighted sum of the outputs from said at least two decoding procedures.

12. A method of claim 1, wherein the source data elements are normalized prior to said decoding step is performed.

13. A method of claim 12, wherein the normalizing comprises:
calculating a scaling factor; and
normalizing the source data elements by multiplying the data elements with the scaling factor.

14. A method of claim 13, wherein the scaling factor is calculated by the equation, $$F = \frac{2\mu}{\sigma^2} \approx \frac{2}{D/M - M}$$

where D is a square mean of the received data elements and M is a mean of the received data elements.

15. A decoder for decoding received source data elements, comprising:

at least two sets of n decoding modules, wherein a first decoding module in each of said sets receives the source data elements as an input, and wherein output data elements of $1^{st}$ to $(n-1)^{th}$ decoding modules in one of said sets are used as an input, respectively, to $2^{nd}$ to $n^{th}$ decoding modules within said one of said sets; and
an output generator for each nth group formed by the nth decoding module from each of said sets, wherein said group decodes received data elements until one output generator outputs the decoded data elements based upon a comparison of the outputs of the groups,
wherein the first decoding module of each of said sets receives two inputs, a first input being a normalized redundant data element, and a second input representing a normalized source data element, and wherein the first decoding modules of each of said sets perform decoding procedures in parallel to each other.

16. A decoder of claim 15, further comprising:
a first normalizer normalizing the received source data elements and outputting normalized source data elements to said first decoding modules of said at least two sets of n decoding modules; and
a plurality of second normalizers normalizing received redundant data elements, wherein one of the plurality of second normalizers outputs the normalized redundant data elements to alternate decoding modules of one set of n decoding modules and wherein the normalized redundant data elements are used to decode the received data elements.

17. A decoder of claim 15, wherein each decoding module comprises:
a maximum likelihood decoder decoding the received data elements by utilizing a modification of a MAP for SOVA algorithm, and outputting intermediate data elements; and
a normalizer normalizing the intermediate decoded data elements by computing a scaling factor for the received data elements and multiplying the intermediate data elements by the computed scaling factor.

18. A decoder of claim 17, wherein each output generator comprises:
a comparator receiving and comparing intermediate data elements from decoding modules of the nth group, and outputting a termination signal when either all or more than half of the intermediate data elements from said decoding modules of the nth group are equivalent; and
a summer outputs the decoded data elements upon receiving the termination signal, wherein said summer calculates and outputs a combination of the intermediate data elements from said decoding modules of the nth group as the decoded data.

19. A decoder of claim 18, wherein the combination is a weighted summation of the intermediate decoded data elements from said decoding modules of the nth group as the decoded data.

20. A decoder of claim 15, wherein one of the decoding modules in one of said sets performs decoding simultaneously with a corresponding decoding module in a different one of said sets.

21. A decoder of claim 15, wherein the output generator compares outputs from the decoding modules in the corresponding group, and combines said outputs from the decoding modules in the corresponding group based on the comparison results.

* * * * *